(12) United States Patent
Shinohara

(10) Patent No.: US 10,827,625 B2
(45) Date of Patent: Nov. 3, 2020

(54) ANISOTROPIC CONDUCTIVE FILM

(71) Applicant: DEXERIALS CORPORATION, Tokyo (JP)

(72) Inventor: Seiichiro Shinohara, Kanuma (JP)

(73) Assignee: DEXERIALS CORPORATION, Tokyo (JP)

( * ) Notice: Subject to any disclaimer, the term of this patent is extended or adjusted under 35 U.S.C. 154(b) by 0 days.

(21) Appl. No.: 15/769,042

(22) PCT Filed: Oct. 31, 2016

(86) PCT No.: PCT/JP2016/082225
§ 371 (c)(1),
(2) Date: Apr. 17, 2018

(87) PCT Pub. No.: WO2017/090379
PCT Pub. Date: Jun. 1, 2017

(65) Prior Publication Data
US 2019/0090354 A1    Mar. 21, 2019

(30) Foreign Application Priority Data

Nov. 26, 2015 (JP) .................................. 2015-230149

(51) Int. Cl.
*H05K 3/32* (2006.01)
*G01N 21/892* (2006.01)
(Continued)

(52) U.S. Cl.
CPC .............. *H05K 3/323* (2013.01); *C09J 7/30* (2018.01); *C09J 9/02* (2013.01); *G01N 21/892* (2013.01);
(Continued)

(58) Field of Classification Search
CPC ........................... H05K 3/233; H01L 23/4985
(Continued)

(56) References Cited

U.S. PATENT DOCUMENTS 6,472,726 B1 * 10/2002 Hashimoto ......... H01L 23/4985
257/668
2010/0162865 A1    7/2010 Innocenzo
(Continued)

FOREIGN PATENT DOCUMENTS

CN      1804601 A  *  7/2006  ............. G01N 21/89
CN    104541417 A     4/2015
(Continued)

OTHER PUBLICATIONS

Oct. 14, 2019 Office Action issued in Korean Patent Application No. 10-2018-7005823.
(Continued)

*Primary Examiner* — Khanh T Nguyen
(74) *Attorney, Agent, or Firm* — Oliff PLC

(57) ABSTRACT

An anisotropic conductive film includes an electrically conductive particle dispersion layer, which includes electrically conductive particles dispersed, in a predetermined dispersion state, in an electrically insulating adhesive. The anisotropic conductive film includes a defective portion indication means configured to provide information about a location of a defective portion regarding the dispersion state of the electrically conductive particles. A bonding method for bonding the anisotropic conductive film to an electronic component is performed such that, in accordance with the information about the location of the defective portion, obtained from the defective portion indication means, a defect-free portion of the anisotropic conductive film is bonded to a region where terminals or terminal arrays are present in the electronic component to be anisotropically conductively connected.

20 Claims, 8 Drawing Sheets

(51) Int. Cl.
*C09J 7/30* (2018.01)
*C09J 9/02* (2006.01)
*H01B 5/16* (2006.01)
*G01N 21/89* (2006.01)
*H01R 4/04* (2006.01)

(52) U.S. Cl.
CPC ........... *H01B 5/16* (2013.01); *G01N 21/8903* (2013.01); *H01R 4/04* (2013.01); *H05K 2201/023* (2013.01)

(58) Field of Classification Search
USPC .................................. 361/760, 772; 257/668
See application file for complete search history.

(56) References Cited

U.S. PATENT DOCUMENTS

| | | | | |
|---|---|---|---|---|
| 2010/0188829 | A1* | 7/2010 | Ito | H05K 3/323 361/772 |
| 2015/0319867 | A1* | 11/2015 | Sato | H05K 3/323 361/760 |

FOREIGN PATENT DOCUMENTS

| | | | | |
|---|---|---|---|---|
| JP | 2001-250905 A | | 9/2001 | |
| JP | 2002-075580 A | * | 3/2002 | ............. H01B 13/01 |
| JP | 2003-222584 A | | 8/2003 | |
| JP | 2004-235227 A | | 8/2004 | |
| JP | 2004-335663 A | | 11/2004 | |
| JP | 2005-209454 A | | 8/2005 | |
| JP | 2007-115560 A | * | 5/2007 | ............. H01B 13/00 |
| JP | 2007-165056 A | | 6/2007 | |
| JP | 2008-28426 A | | 2/2008 | |
| JP | 2009-152160 A | | 7/2009 | |
| JP | 2010-033793 A | | 2/2010 | |
| JP | 2010-251337 A | | 11/2010 | |
| JP | 2010-257983 A | | 11/2010 | |
| JP | 5147048 B2 | | 2/2013 | |
| JP | 5147049 B2 | | 2/2013 | |
| JP | 2014-071067 A | | 4/2014 | |
| JP | 2015-197985 A | | 11/2015 | |

OTHER PUBLICATIONS

Aug. 14, 2019 Office Action issued in Korean Patent Application No. 10-2018-7005823.
Oct. 30, 2019 Office Action issued in Chinese Patent Application No. 201680066280.3.
Dec. 20, 2016 International Search Report issued in International Patent Applicaiton PCT/JP2016/082225.
Dec. 20, 2016 Written Opinion issued in International Patent Applicaiton PCT/JP2016/082225.
Oct. 25, 2017 International Preliminary Report on Patentability issued in International Patent Application PCT/JP2016/082225.
Apr. 16, 2019 Office Action issued in Korean Application 10-2018-7005823.
Mar. 1, 2019 Office Action issued in Chinese Application No. 201680066280.3.
Oct. 8, 2019 Office Action issued in Japanese Patent Application No. 2015-230149.
Apr. 21, 2020 Office Action issued in Chinese Patent Application No. 201680066280.3.

* cited by examiner (CROSS SECTION A-A)

(CROSS SECTION A-A)

(CROSS SECTION A-A)

(CROSS SECTION A-A)

us10,827,625 B2

ANISOTROPIC CONDUCTIVE FILM

TECHNICAL FIELD

The present invention relates to an anisotropic conductive film, an anisotropic conductive film bonding method, and an anisotropic conductive film bonding apparatus.

BACKGROUND ART

Anisotropic conductive films are widely used when electronic components such as IC chips are mounted on substrates. In recent years, demand has arisen for high density wiring/interconnections in small electronic devices such as mobile phones, and notebook computers. To utilize an anisotropic conductive film in such high density wiring/interconnections, various techniques for regularly aligning and disposing electrically conductive particles have been studied. For example, the following techniques are known. In one technique (Patent Documents 1 and 2), electrically conductive particles are spread over a stretch film and the film is biaxially stretched to thereby align and dispose the electrically conductive particles in a single layer. In another technique (Patent Documents 3, 4, and 5), electrically conductive particles are held on a base material and the electrically conductive particles are transferred to an adhesive film, to thereby place the electrically conductive particles in a predetermined arrangement.

CITATION LIST

Patent Document

Patent Document 1: JP 5147048 B
Patent Document 2: JP 5147049 B
Patent Document 3: JP 2007-165056 A
Patent Document 4: JP 2005-209454 A
Patent Document 5: JP 2004-335663 A

SUMMARY OF INVENTION

Technical Problem

However, even when such a technique as disclosed in, for example, Patent Document 1, 2, 3, 4, or 5 is used for aligning and disposing electrically conductive particles to produce an anisotropic conductive film, it is difficult to completely prevent loss and aggregation of electrically conductive particles. When an anisotropic conductive film is used to connect electronic components together, loss or aggregation of electrically conductive particles can result in a poor conduction or a short circuit.

One possible approach to address this is to inspect, prior to shipment, the dispersion state of electrically conductive particles in anisotropic conductive films and dispose of anisotropic conductive films having loss or aggregation. This method, however, results in a decreased production yield of anisotropic conductive films and thus an increased cost of producing anisotropic conductive films.

Accordingly, embodiments of the present invention are directed to preventing a poor conduction and a short circuit even when using, for connection of electronic components, an anisotropic conductive film having loss or aggregation of electrically conductive particles as compared with a predetermined dispersion state thereof.

Solution to Problem

The present inventor found that the above problems can be solved in the following manner and conceived the present invention. In an anisotropic conductive film, the dispersion state of the electrically conductive particles may be inspected. In the case that a defect regarding the dispersion state, such as loss or aggregation of electrically conductive particles, is found, the anisotropic conductive film may be configured such that the defective portion is identifiable and that, when connecting electronic components together by using the anisotropic conductive film, the defective portion can be avoided. The finding of a defective portion may be made in comparison with a predetermined dispersion state, regarding, for example, a predetermined lattice arrangement, a predetermined side-by-side disposition, and uniform dispersion at a predetermined particle density.

An aspect of the present invention provides an anisotropic conductive film including an electrically conductive particle dispersion layer. The electrically conductive particle dispersion layer includes electrically conductive particles dispersed, in a predetermined dispersion state, in an electrically insulating adhesive. The anisotropic conductive film includes a defective portion indication means configured to provide information about a location of a defective portion regarding the dispersion state of the electrically conductive particles.

In one embodiment, the indication means for providing information about a location of a defective portion may be a mark provided for the anisotropic conductive film. In another embodiment, the anisotropic conductive film may include a defective portion information storage means, and the defective portion information storage means may include a recording medium containing the information about a location of a defective portion.

Another aspect of the present invention provides a method for bonding the anisotropic conductive film to an electronic component. The method is as follows. In accordance with the information about the location of the defective portion, a defect-free portion of the anisotropic conductive film is bonded to a region where a terminal or a terminal array is present in the electronic component to be anisotropically conductively connected. The information is obtained from the defective portion indication means.

Still another aspect of the present invention provides a bonding apparatus configured to bond the anisotropic conductive film to an electronic component. The bonding apparatus includes a positioning means and a pressing means. The positioning means is configured to, in accordance with the information about the location of the defective portion, position the anisotropic conductive film and the electronic component with respect to each other to connect a defect-free portion of the anisotropic conductive film to a terminal of the electronic component. The information is obtained from the defective portion indication means. The pressing means is configured to bond the anisotropic conductive film to the electronic component.

Advantageous Effects of Invention

Anisotropic conductive films of embodiments of the present invention include a defective portion indication means configured to provide information about the locations of defective portions regarding the dispersion state of electrically conductive particles. Bonding methods of embodiments of the present invention and bonding apparatuses of embodiments of the present invention use an anisotropic conductive film of an embodiment of the present invention. With such a bonding method or such a bonding apparatus, the following is achieved. In accordance with the information about the locations of defective portions, obtained from the defective portion indication means, only a defect-free portion of the anisotropic conductive film, in other words, only regions free of defective portions in the anisotropic conductive film can be bonded to a region where terminals or terminal arrays are present in an electronic component to be anisotropically conductively connected. Thus, connection to terminals of an electronic component can be accomplished by using only a defect-free portion of the anisotropic conductive film. As a result, reliability of connection that uses the anisotropic conductive film is improved without decreasing the production yield of the anisotropic conductive film.

DESCRIPTION OF EMBODIMENTS

Figure 1:
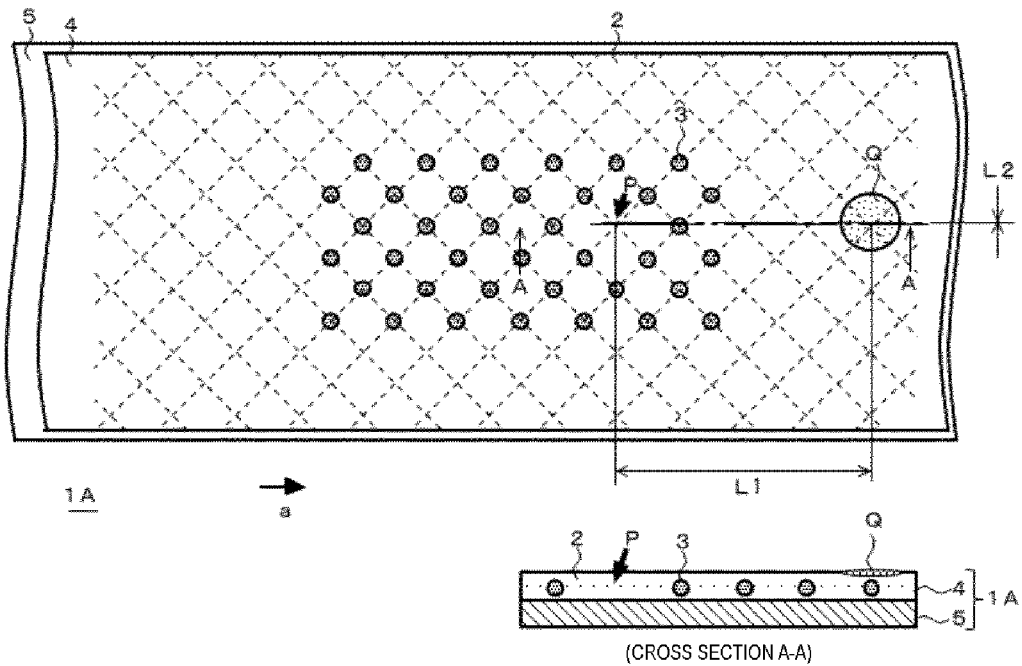
FIG. 1 is a schematic plan view of an anisotropic conductive film 1A including a mark, according to an example. The mark is a defective portion indication means.

Hereinafter, the present invention will be described in detail with reference to the attached drawings. Note that in the drawings, identical reference signs indicate the same or equivalent constituents.

Anisotropic Conductive Film Including a Mark

FIG. 1 is a schematic plan view of an anisotropic conductive film 1A, according to an example of the present invention. The anisotropic conductive film 1A can be used for FOG or COG, for example. The anisotropic conductive film 1A has a layer configuration in which an electrically conductive particle dispersion layer 4 and a base material film 5 are laminated together. The electrically conductive particle dispersion layer 4 includes electrically conductive particles 3 dispersed, in a predetermined dispersion state, in an electrically insulating adhesive 2. More specifically, in the electrically conductive particle dispersion layer 4, the electrically conductive particles 3 are arranged in a square lattice and positioned at respective lattice points, which are intersection points on lattice lines. The lattice lines are indicated by the dashed lines in FIG. 1.

In the present invention, the phrase "electrically conductive particles are dispersed in a predetermined dispersion state" means that the electrically conductive particles are present in a predetermined regular manner. The electrically conductive particles may be arranged in a square lattice, or instead, may be arranged in a rectangular lattice, in an oblique lattice, or in a hexagonal lattice, for example. At each of the lattice points, a single electrically conductive particle may be disposed, or instead, a group of predetermined number of electrically conductive particles may be disposed. The electrically conductive particles may be aligned side by side with a predetermined interparticle spacing, or instead, may be randomly dispersed while maintaining a predetermined interparticle spacing. The method for dispersing the electrically conductive particles in a predetermined dispersion state is not particularly limited. For example, as disclosed in Patent Documents 1 and 2, it is possible to employ a method that utilizes biaxial stretching of a film over which electrically conductive particles are spread, or as disclosed in Patent Documents 3, 4, and 5, it is possible to employ a method that transfers electrically conductive particles held on a base material to a film. A known method using a transfer mold may be employed. The technique is disclosed in, for example, JP 2009-152160 A or JP 2010-33793 A.

The configuration of the electrically conductive particles themselves, the number density thereof, and the composition of the electrically insulating adhesive itself are not particularly limited and may be the same as those of a known anisotropic conductive film.

Even when an attempt is made to produce an anisotropic conductive film in which electrically conductive particles are dispersed in a predetermined dispersion state, the resulting actual anisotropic conductive film may include defective portions, where a predetermined dispersion state of the electrically conductive particles is not present. Examples of such defective portions include the following. In the case that the electrically conductive particles are to be arranged in a lattice form, one defective portion is a portion where no electrically conductive particle is present at a lattice point, or another defective portion is a portion where electrically conductive particles aggregate at a lattice point or a different location. In anisotropic conductive films in which electrically conductive particles are to be uniformly dispersed at a predetermined disposition density regardless of the presence or absence of a lattice form arrangement, or in anisotropic conductive films for COG, in which electrically conductive particles are disposed at relatively high density, for example, one defective portion is a portion where electrically conductive particles locally concentrate or aggregate. In the case that the electrically conductive particles are metal, one defective portion is a portion where aggregation due to magnetic attraction occurs. FIG. 1 illustrates an example of a defective portion. In this embodiment, the anisotropic conductive film 1A is configured to include electrically conductive particles arranged in a square lattice. The anisotropic conductive film 1A has a defective portion P, where no electrically conductive particle 3 is present at a lattice point.

The defective portion P can be discovered by inspecting the dispersion state of the electrically conductive particles in the anisotropic conductive film 1A by using an imaging device and an image analysis tool (e.g., WinRooF from MITANI Corporation) in combination, and thus the location can be identified. The imaging device may be, for example, a device having a maximum number of output pixels (H)×(V) of 648×494 and a frame rate of from 30 to 60 fps.

The anisotropic conductive film 1A according to the example includes a mark Q. The mark Q is a defective portion indication means for indicating the defective portion P. The mark Q is an irradiation mark having a diameter of from 0.3 to 1.0 mm and is formed by applying laser beam irradiation to the anisotropic conductive film 1A from the electrically conductive particle dispersion layer 4-side and causing the surface conditions of the resin included in the electrically conductive particle dispersion layer 4 to be changed or modified (thermoset). In the case that the anisotropic conductive film 1A includes a transparent cover film on the electrically conductive particle dispersion layer 4 to prevent entry of foreign matter, the laser beam irradiation may be applied to the electrically conductive particle dispersion layer 4 via the cover film.

The conditions for laser beam irradiation for forming such an irradiation mark depend on the material of the surface of the anisotropic conductive film 1A, which is to be subjected to laser beam irradiation. For example, in the case that the surface includes a thermosetting resin, such as PET, a YAG laser or a YVO4 laser may be used. For example, in the case that a cover film including transparent PET is laminated on the electrically conductive particle dispersion layer 4, laser beam irradiation may be applied to the cover film for from 100 to 1000 milliseconds. The laser beam may have a wavelength of 1064 nm and an output of from 1.3 to 10 W. Thus, the mark Q can be formed only in or on the resin included in the electrically conductive particle dispersion layer 4. The thickness of the cover film may be from 10 to 50 µm for practical use.

The mark Q may be formed in or on the base material film 5. From a standpoint of forming the mark Q in a short time, it is preferable that the mark Q be formed by modifying (thermosetting) the curable resin included in the electrically conductive particle dispersion layer 4. From a standpoint of avoiding addition of unnecessary energy to the resin, which is to be used for anisotropically conductive connection, it is preferable that the mark Q be formed in or on the base material film 5. When forming the mark Q in or on the anisotropic conductive film 1A by laser beam irradiation, care needs to be taken to prevent formation or scattering of foreign matter, which will interfere with connection that uses the anisotropic conductive film 1A.

In the anisotropic conductive film 1A according to the example, the mark Q is provided downstream of the defective portion P, in a flow direction a. The flow direction a is a direction of the anisotropic conductive film 1A in connection operation. This configuration is provided from a standpoint of specifying a certain area upstream of the mark Q as a region not to be used for connection of electronic components in connection operation that uses the anisotropic conductive film 1A. Depending on the configuration of the apparatus used in a connection step, the mark Q may be formed upstream of a defective portion P, in the flow direction a of the anisotropic conductive film 1A. This is because, in a connection step that uses the anisotropic conductive film, in the case that the mark Q is discovered, it is sufficient that a defective portion P in the vicinity of the mark Q not be used for the connection. That is, the step of detecting a defective portion P after formation of the anisotropic conductive film and forming the mark Q may be performed in any of the steps subsequent to formation of the anisotropic conductive film, and the mark Q may be provided either upstream or downstream of the defective portion P.

A distance L1, between a center of the mark Q and a defective portion P in a longitudinal direction of the anisotropic conductive film 1A, is set to a predetermined distance. This is to ensure productivity for the anisotropic conductive film and to reduce portions, of the anisotropic conductive film, that will not be used for connection because of the presence of the defective portion P. Specifically, in a case where the distance L1 is too short, the winding speed for the anisotropic conductive film needs to be decreased after formation of the mark Q in the process of producing the anisotropic conductive film, and this decreases the productivity. Thus, the distance L1 is preferably greater than or equal to 1 mm, more preferably greater than or equal to 2 mm, and even more preferably greater than or equal to 3 mm. On the other hand, too long a distance L1 is not preferred because, in such a case, regions usable for connection in the anisotropic conductive film are too small. Accordingly, it is preferable that the distance L1 be less than or equal to half the length, of the anisotropic conductive film, that is necessary for connection of each of electronic components. Thus, the preferred length of the distance L1 depends on the length of the electronic component to be connected. For example, when used for COG, the distance L1 is preferably less than or equal to 15 mm, more preferably less than or equal to 10 mm, and even more preferably less than or equal to 5 mm.

A distance L2, between the center of the mark Q and the defective portion P in a short-side direction (width direction) of the anisotropic conductive film 1A, may be zero as illustrated. Regardless of the location of the defective portion P, the mark Q may be located near a side edge of the anisotropic conductive film 1A in the longitudinal direction. In the latter case, when connecting the anisotropic conductive film to an electronic component, regions where detection of the mark Q needs to be performed can be limited to regions near a side edge of the anisotropic conductive film. Further, depending on the film width of the anisotropic conductive film and the size of an electronic component, areas near a side edge of the anisotropic conductive film in the longitudinal direction may not be used inherently for connection of electronic components. In such a case, by providing the mark Q near the side edge of the anisotropic conductive film in the longitudinal direction, regions that are unusable for connection of electronic components because of the presence of the mark Q can be reduced.

Methods for forming the mark Q include the following, in addition to forming of an irradiation mark by laser irradiation. The mark Q may be a colored site formed as follows.

A material that becomes colored or undergoes color change when irradiated with light of a certain wavelength may be dispersed in the base material film 5, and the base material film 5 may be irradiated with light of the wavelength. Instead, the mark Q may be formed by printing or by attachment of a label.

Figure 2:
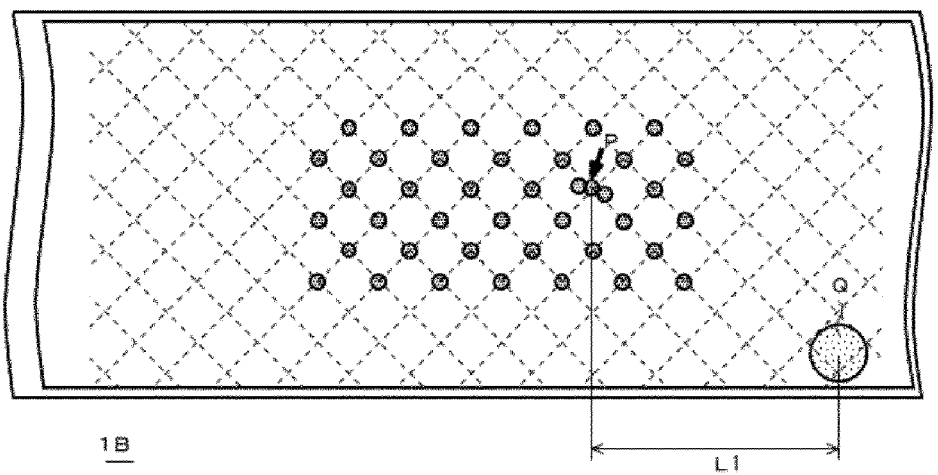
FIG. 2 is a schematic plan view of an anisotropic conductive film 1B including a mark, according to an example. The mark is a defective portion indication means.

FIG. 2 illustrates an anisotropic conductive film 1B. The anisotropic conductive film 1B is similar to the above-described anisotropic conductive film 1A except that the mark Q is provided in association with a defective portion P where a plurality of electrically conductive particles aggregate at one lattice point. In this case, the formation location for the mark Q is as follows. In a longitudinal direction of the anisotropic conductive film 1B, the predetermined distance L1 is a distance between the lattice point, in the defective portion P, where an electrically conductive particle should be inherently located and a center of the mark Q. In a short-side direction of the anisotropic conductive film, the formation location is near a side edge of the anisotropic conductive film 1B in the longitudinal direction.

Figure 3:
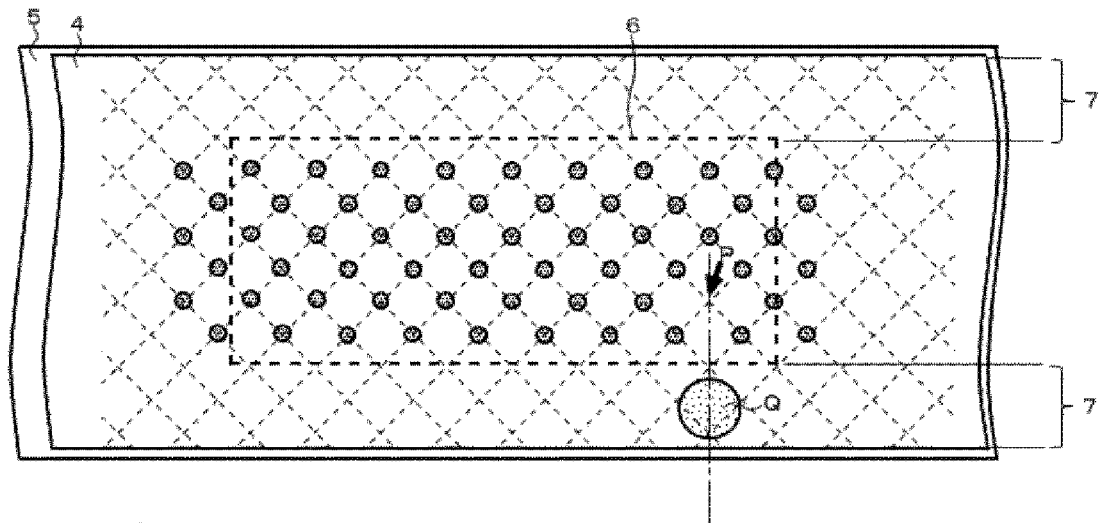
FIG. 3 is a schematic plan view of an anisotropic conductive film 1C including a mark, according to an example. The mark is a defective portion indication means.

FIG. 3 is a schematic plan view of an anisotropic conductive film 1C for COG, according to an example. The anisotropic conductive film 1C for COG includes a region 7 between the sides of the anisotropic conductive film 1C and an electronic component (chip) bonding location 6, which is indicated by the dashed line in FIG. 3. It is preferable that the mark Q corresponding to a defective portion P be formed in or on the region 7. When the mark Q is present in or on the region 7, regions that cannot be used for connection of an electronic component (chip) can be reduced.

Figure 4:
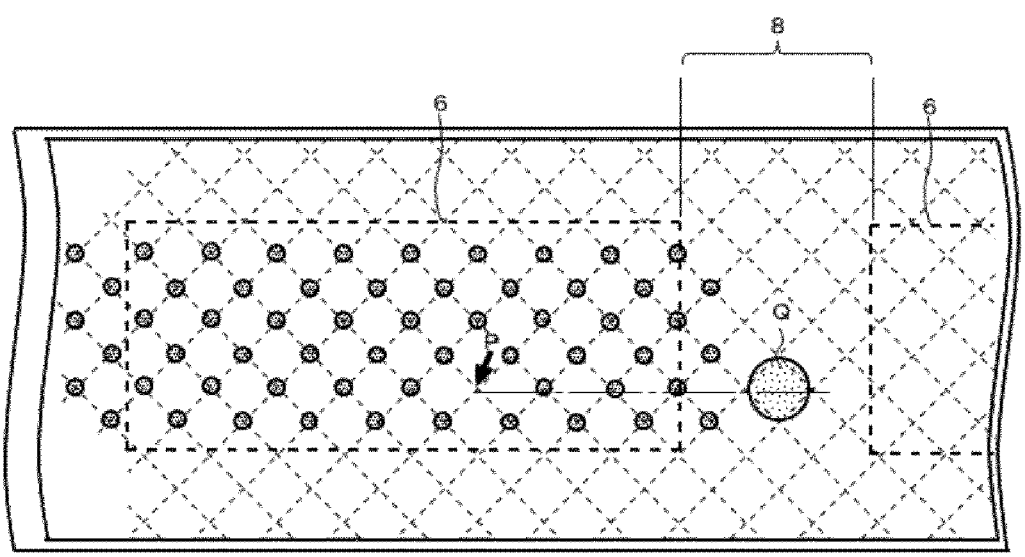
FIG. 4 is a schematic plan view of an anisotropic conductive film 1D including a mark, according to an example. The mark is a defective portion indication means.

FIG. 4 illustrates an anisotropic conductive film 1D for COG, according to an example. As in this example, the mark Q corresponding to a defective portion P may be formed in or on an electronic component (chip) non-bonding region 8, which is periodically present on the anisotropic conductive film in the longitudinal direction.

Bonding Method for Anisotropic Conductive Film Including a Mark

By using, for connection of electronic components, the anisotropic conductive film including a mark Q, only defect-free portions of the anisotropic conductive film, in accordance with information about the location of a defective portion indicated by the mark Q, can be bonded to the region where terminals or terminal arrays are present in the electronic component to be anisotropically conductively connected. The present invention includes such a bonding method. The bonding method includes the following two embodiments. In one embodiment, only defect-free portions of the anisotropic conductive film are bonded to an electronic component. In another embodiment, not only defect-free portions but also a defective portion P and the mark Q are bonded to an electronic component while ensuring that the bonding location for the defect-free portion P and the mark Q are locations that do not interfere with anisotropically conductive connection of electronic components. In the latter embodiment, a check is performed to determine whether the bonding locations for the defective portion P and the mark Q are locations that can interfere with anisotropically conductive connection of electronic components. In the case that the locations can cause interference, adjustments are made. For example, positioning between the anisotropic conductive film and the electronic components is adjusted, forwarding or take-up of the anisotropic conductive film is adjusted, and/or the size of the thermocompression bonding head used for bonding is adjusted. The former embodiment (embodiment in which only defect-free portions of the anisotropic conductive film are bonded to an electronic component) will be described in detail below.

First Bonding Method

FIGS. 5A to 5F illustrate an embodiment of such a bonding method. FIGS. 5A to 5F each illustrate a step in a method for bonding an anisotropic conductive film 1 to a first electronic component. Examples of the first electronic component include FPCs, rigid substrates, ceramic substrates, plastic substrates, and glass substrates. As described below, in this bonding method, a specified region 11, which includes a defect portion P, is removed from the anisotropic conductive film 1 and a remaining defect-free portion is bonded to an electronic component.

The anisotropic conductive film 1 used here has, for example, a laminate structure including the electrically conductive particle dispersion layer 4 and the base material film 5. The mark Q is provided a predetermined distance downstream of the defective portion P in the flow direction of the film.

Figure 5A:
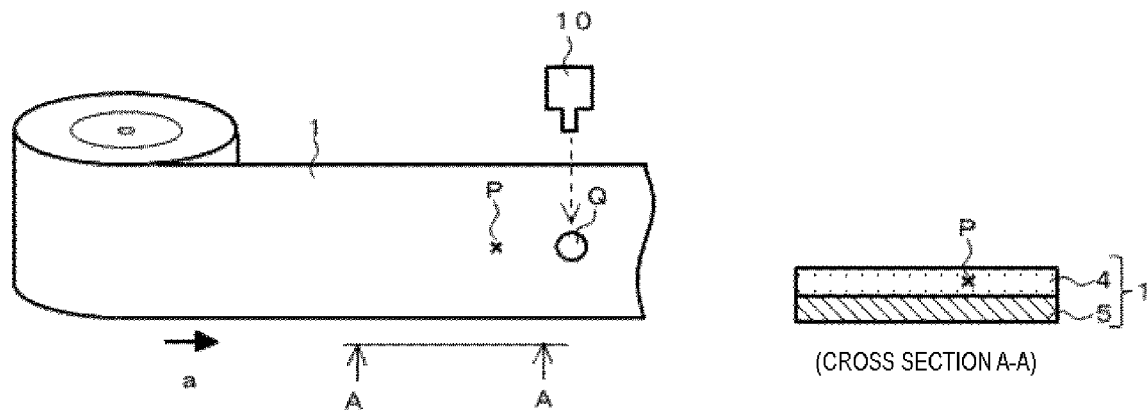
FIG. 5A is a diagram illustrating a step in a method for bonding an anisotropic conductive film including a mark to an electronic component.

First, as illustrated in FIG. 5A, the anisotropic conductive film 1, wound on a reel, is unwound, and detection of the mark Q is performed by using a mark detection device 10, which uses a CCD, for example. The mark detection device 10 may be a device using, for example, a CCD, a chromaticity sensor, or a laser. For example, an alignment mark detection device may be used.

Figure 5B:
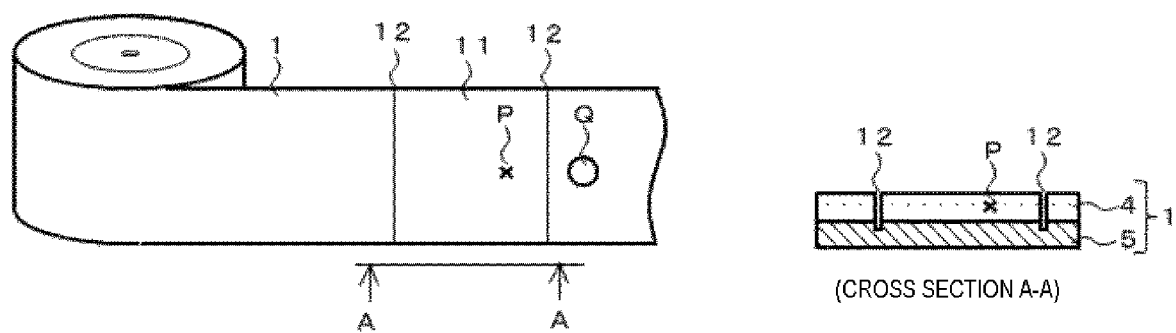
FIG. 5B is a diagram illustrating a step in the method for bonding an anisotropic conductive film including a mark to an electronic component.

Next, to remove a specified region 11 including the defective portion P, which is indicated by the mark Q, first, half cuts 12 are formed along the lines defining the region 11 by using a half cut formation means. It is preferable that the half cuts 12 be formed to reach the base material film 5 from the electrically conductive particle dispersion layer 4-side in the anisotropic conductive film 1 (FIG. 5B).

Figure 5C:
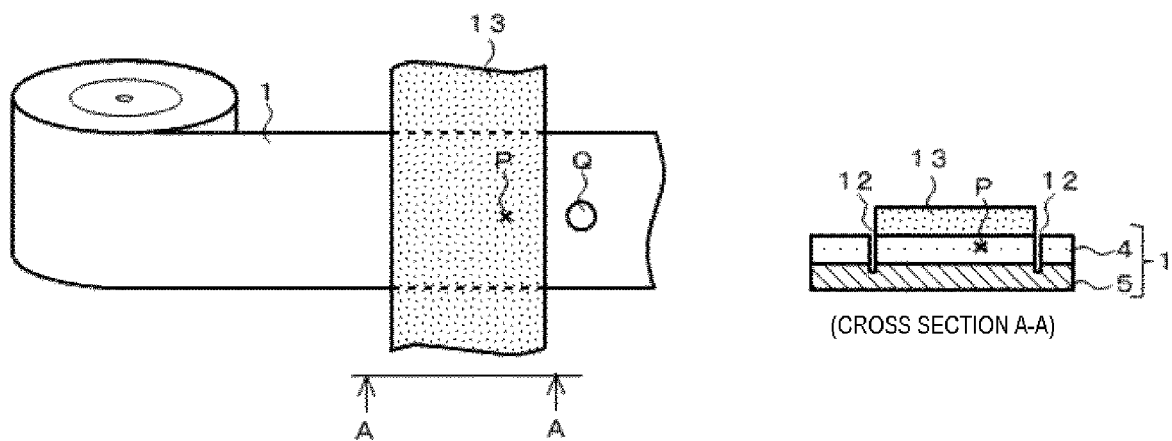
FIG. 5C is a diagram illustrating a step in the method for bonding an anisotropic conductive film including a mark to an electronic component.
Figure 5D:
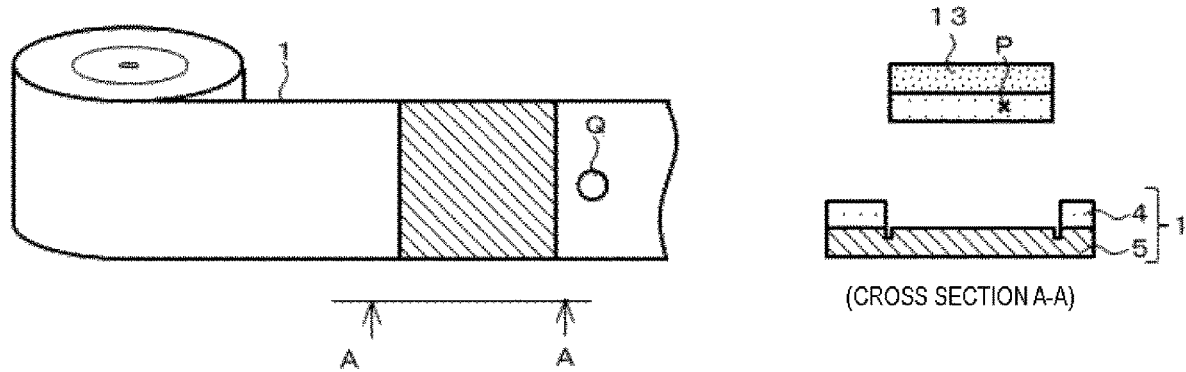
FIG. 5D is a diagram illustrating a step in the method for bonding an anisotropic conductive film including a mark to an electronic component.

Next, an adhesive tape 13 is bonded to the top of the region 11, which includes the defective portion P and is to be removed (FIG. 5C). The adhesive tape 13 is peeled off to transfer the portion of the electrically conductive particle dispersion layer 4, corresponding to the region 11, to the adhesive tape 13 (FIG. 5D).

Figure 5E:
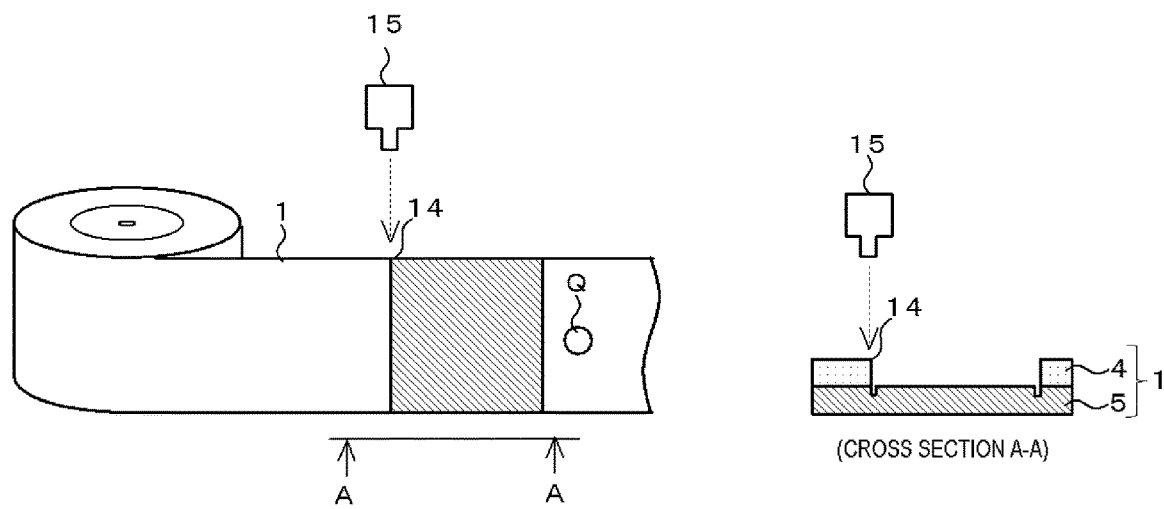
FIG. 5E is a diagram illustrating a step in the method for bonding an anisotropic conductive film including a mark to an electronic component.
Figure 5F:
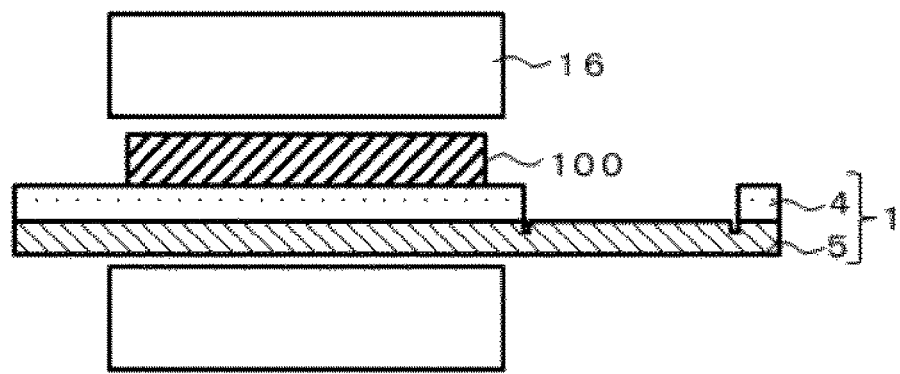
FIG. 5F is a diagram illustrating a step in the method for bonding an anisotropic conductive film including a mark to an electronic component.

After the portion of the electrically conductive particle dispersion layer 4 corresponding to the region 11 is removed, an edge portion 14 of the electrically conductive particle dispersion layer 4, remaining on the anisotropic conductive film 1, is detected by an edge detection device 15, which uses, for example, a CCD (FIG. 5E). By using a positioning means (not illustrated), positioning between the anisotropic conductive film 1 and a first electronic component 100 is performed with the edge 14 being the reference. Examples of the first electronic component 100 include FPCs, rigid substrates, ceramic substrates, plastic substrates, and glass substrates. By using a thermocompression bonding device 16 as a pressing means, temporary bonding of the anisotropic conductive film 1 to the first electronic component 100 is performed (FIG. 5F).

Subsequently, by a commonly used method, the base material film 5 is released and removed from the anisotropic conductive film 1, which is temporarily bonded to the first electronic component 100. The anisotropic conductive film 1 is then placed on a second electronic component, such as an IC chip, IC module, or FPC, and bonding is performed. Second electronic components may be anisotropically conductively connected together by performing bonding as described above on, for example, IC chips or IC modules and stacking the components together.

Thus, even with an anisotropic conductive film 1 having a defective portion P, connection of electronic components by using only regions free of defective portions P can be achieved. The present invention also includes a bonding apparatus. The bonding apparatus is configured to, in accordance with information about the location of a defective portion P indicated by the mark Q, bond the anisotropic conductive film, only at regions free of defective portions P, to an electronic component, as described above.

Second Bonding Method

Another method for bonding the anisotropic conductive film, only at regions free of defective portions P, to an electronic component, in accordance with information about the location of a defective portion indicated by the mark Q, may be as follows. The specified region 11 including a defective portion may remain on the base material film 5 and the region 11 may be allowed to exit without being used for connection to an electronic component.

Figure 6A:
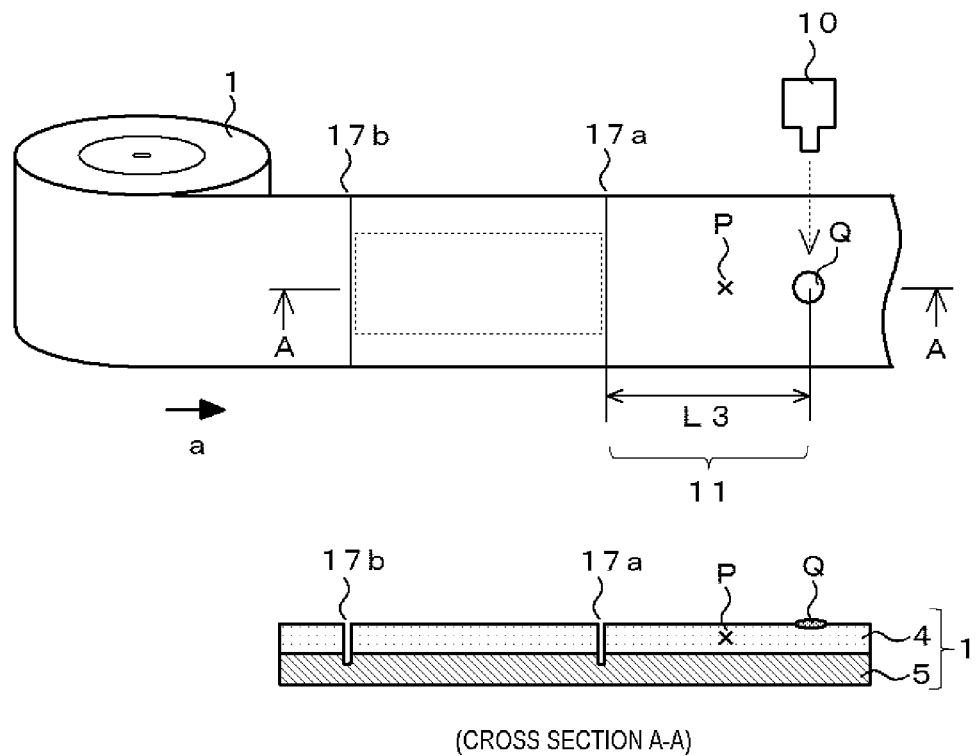
FIG. 6A is a diagram illustrating a step in a method for bonding an anisotropic conductive film including a mark to an electronic component.
Figure 6B:
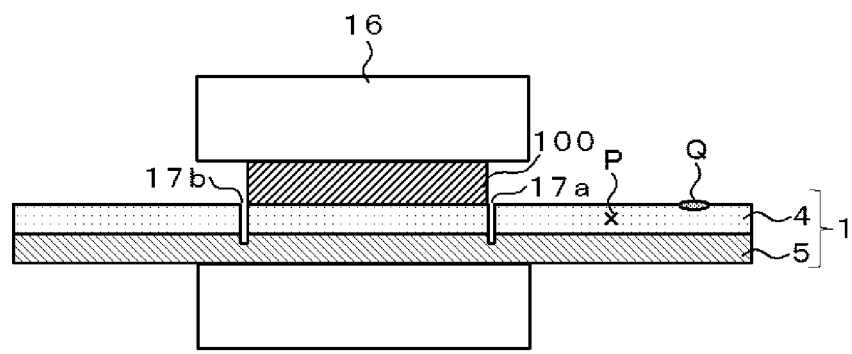
FIG. 6B is a diagram illustrating a step in the method for bonding an anisotropic conductive film including a mark to an electronic component.
Figure 6C:
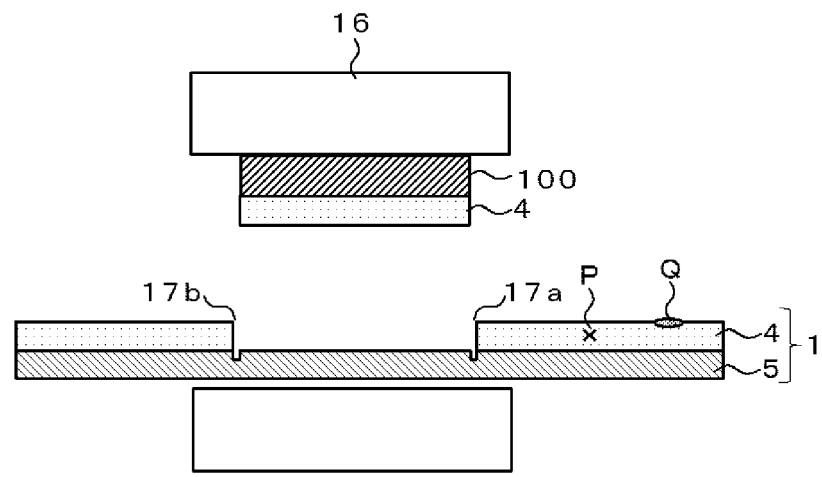
FIG. 6C is a diagram illustrating a step in the method for bonding an anisotropic conductive film including a mark to an electronic component.

For example, as illustrated in FIG. 6A, upon detection of the mark Q from the anisotropic conductive film 1, which is unwound from a reel, a half cut 17a is formed in a position located upstream of the defective portion P, away from the mark Q by a predetermined distance L3 from a center of the mark. Further, a half cut 17b is also formed in a position located upstream of the half cut 17a and defines a bonding location for an electronic component. Next, as illustrated in FIG. 6B, positioning is performed by a positioning means so that a region between the half cuts 17a and 17b can be bonded to the electronic component 100, and temporary bonding is performed by the thermocompression bonding device 16. Thus, as illustrated in FIG. 6C, the portion of the electrically conductive particle dispersion layer 4 bonded to the electronic component 100 is released from the base material film 5, and the defective portion P is allowed to exit while remaining on the base material film 5.

In the case that, as described above, a defective portion P is allowed to exit while remaining on the base material film 5, it is possible that the half cuts 17a and 17b may not be provided and the formation location for the half cut 17a may be configured as a reference location, which may indicate that an electronic component is to be bonded to an area upstream of the reference location.

Third Bonding Method

Another method for bonding the anisotropic conductive film, only at regions free of defective portions P, to an electronic component, in accordance with information about the location of a defective portion indicated by the mark Q, may be as follows. The specified region 11 including a defective portion P may be cut away from the anisotropic conductive film, and remaining regions, which do not include a defective portion, may be used for connection to an electronic component.

Figure 7A:
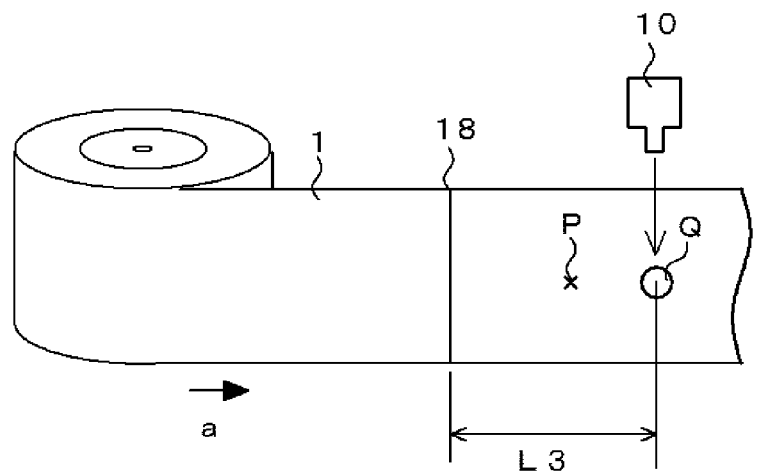
FIG. 7A is a diagram illustrating a step in a method for bonding an anisotropic conductive film including a mark to an electronic component.
Figure 7B:
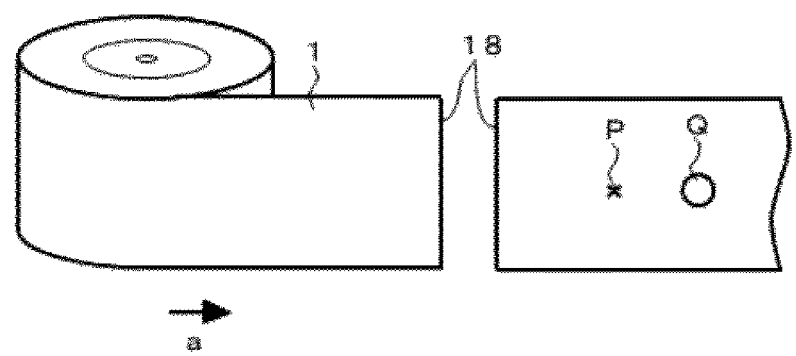
FIG. 7B is a diagram illustrating a step in the method for bonding an anisotropic conductive film including a mark to an electronic component.

For example, as illustrated in FIG. 7A, upon detection of the mark Q from the anisotropic conductive film 1, which is unwound from a reel, the anisotropic conductive film 1 is cut at a position located upstream of the defective portion P, away from the mark Q by the predetermined distance L3 from the center of the mark. In FIGS. 7A and 7B, the cutting line is indicated at numeral 18. Subsequently, after the specified region 11 including the defective portion P is cut away, positioning between the remaining portion of the anisotropic conductive film 1 (FIG. 7B) and an electronic component is performed, and bonding is performed.

Figure 8:
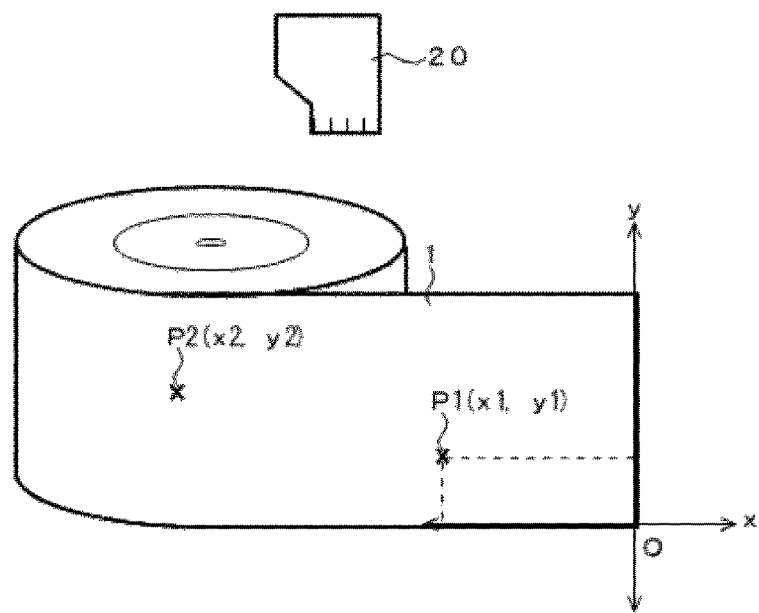
FIG. 8 is a diagram illustrating information about the location of a defective portion, which is to be contained in a defective portion information storage means.

Anisotropic Conductive Film Including a Recording Medium Containing Defective Portion Information In anisotropic conductive films of embodiments of the present invention, the defective portion indication means for providing information about the location of a defective portion P may be, instead of the mark Q described above, a defective portion information storage means, which may be a recording medium containing information about the locations of defective portions. Here, the information about the locations of defective portions may be as follows. For example, as illustrated in FIG. 8, the anisotropic conductive film 1 may have an x-y coordinate system with a predetermined position being an origin O. The coordinate axes may be the short-side direction and the longitudinal direction of the anisotropic conductive film. The locations of defective portions P1, P2, and more may be represented by the coordinates x and y. The information about the locations of defective portions may be contained in a memory card 20 and the memory card 20 may accompany the product of the anisotropic conductive film 1.

The bonding apparatus for bonding the anisotropic conductive film 1 to the electronic component 100 performs the first, second, or third bonding method described above, in accordance with defective portion information read from the memory card 20.

In embodiments of the present invention, the defective portion information storage means, which may include a recording medium containing information about the locations of defective portions, may include the memory card 20 or, for example, a known information recording medium, such as a USB memory. Location information may be contained in a small IC chip and this may be attached to, for example, a packing bag of the film or a reel so that the IC chip can accompany the anisotropic conductive film, and the location information may be read by utilizing short-range wireless communication technology, such as NFC.

Figure 9:
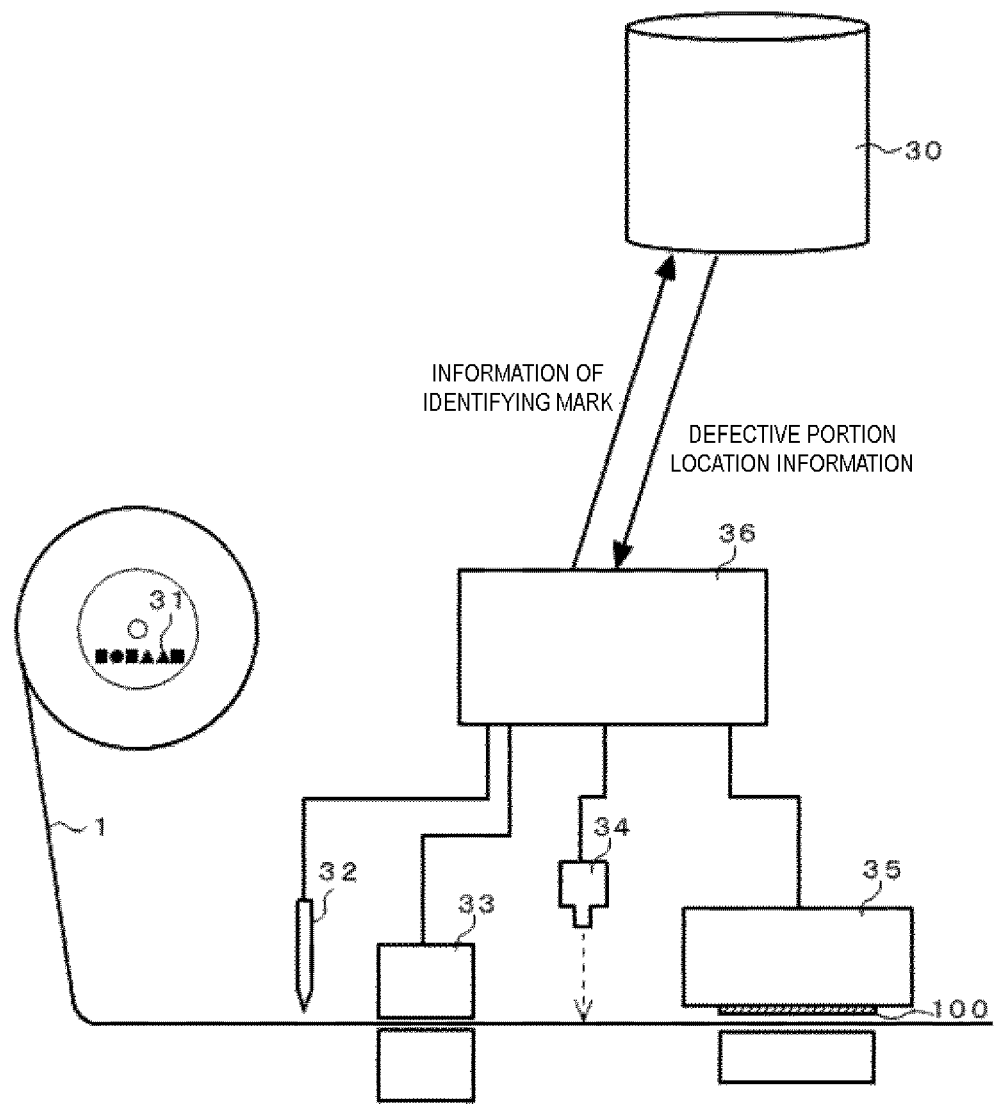
FIG. 9 is a schematic diagram of a bonding apparatus for bonding an anisotropic conductive film including a defective portion information storage means to an electronic component.

As illustrated in FIG. 9, the defective portion information storage means, which may include a recording medium containing information about the locations of defective portions, may be incorporated into a computing device 30 for management, which performs, for example, quality control and product management for the anisotropic conductive film. In such a case, for example, an identifying mark 31 may be provided to the product package or another location of the anisotropic conductive film 1. The defective portion information can be obtained from the computing device 30 via the identifying mark 31. The identifying mark 31 may include characters, numerals, symbols, or a combination of these, for example. The identifying mark 31 may be represented by a two-dimensional code (QR code (registered trademark) or a bar code, for example). It is also possible that defective portion information may be retrieved from the computing device 30, in accordance with the product lot number of the anisotropic conductive film 1, and may be separately sent via email, for example.

The computing device 30, which records information about the locations of defective portions, may be configured to store information regarding the quality of connection of an electronic component when it is actually used by using the location information. The information may be sent back to the anisotropic conductive film shipping destination, and as a result, the effect of achieving improved quality control and more efficient response can be expected.

A bonding method for bonding an anisotropic conductive film 1 including the identifying mark 31 to the electronic component 100 may be as follows, for example. As illustrated in FIG. 9, a bonding apparatus used for the bonding may include a half cut formation means 32, an adhesive tape bonding means 33, an edge detection means 34, a positioning means, a thermocompression bonding device 35, and a controller 36. The half cut formation means 32 forms a half cut in the anisotropic conductive film, in accordance with information about the location of a defective portion. The adhesive tape bonding means 33 bonds an adhesive tape that allows a specified region including a defective portion P to be transferred thereto. The edge detection means 34 detects the edge of the anisotropic conductive film 1 after removal of the specified region including the defective portion P. The positioning means positions, after detection of the edge, the anisotropic conductive film and the electronic component with respect to each other. The thermocompression bonding device 35 bonds the anisotropic conductive film to the electronic component. The controller 36 controls the operations of these means and device. When the controller 36 and the computing device 30 for product management of the anisotropic conductive film are connected to each other via a communication line, the controller 36 transmits information of the identifying mark 31 to the computing device 30 and the computing device 30 transmits, to the controller 36, information about the location of a defective portion, corresponding to the identifying mark 31. Thus, in accordance with the information about the location of a defective portion, the controller 36 enables bonding of a defect-free portion of the anisotropic conductive film 1 to the electronic component.

With this method, information about the location of a defective portion, unique to the anisotropic conductive film 1 including the identifying mark 31, is provided by the computing device 30. This makes it possible to distinguish genuine anisotropic conductive film products that are under product management from counterfeit anisotropic conductive film products produced by imitation of the anisotropic conductive film.

EXAMPLES

Next, the present invention will be described in detail using examples.
(1) Production of Anisotropic Conductive Film
(1-1) Production of Anisotropic Conductive Film in which there is Loss in Arrangement of Electrically Conductive Particles An anisotropic conductive film including electrically conductive particles arranged in a tetragonal lattice was produced in the manner described below. In the anisotropic conductive film, no electrically conductive particle was present at some lattice points.

A nickel plate having a thickness of 2 mm was prepared, and cylindrically-shaped concave portions (an inner diameter 5 µm and depth 6 µm) were formed in a tetragonal lattice pattern. Thus, the transfer body master was obtained (the distance between centers of adjacent concave portions was 8 µm and the density of the concave portions was 16000/mm$^2$). At some lattice points in the tetragonal lattice pattern, concave portions were not formed, intentionally. Thus, defects were formed in the lattice arrangement of the concave portions. (design value 14400/mm$^2$)

The resultant transfer body master was applied with a photopolymerizable resin composition containing 60 parts by mass of phenoxy resin (YP-50, Nippon Steel & Sumikin Chemical Co., Ltd.), 29 parts by mass of acrylate resin (M208, Toagosei Co., Ltd.), and 2 parts by mass of photopolymerization initiator (IRGACURE184, BASF Japan Ltd.) on a PET film to a dried thickness of 30 µm, and after drying for five minutes at 80° C., light irradiation at 1000 mJ was performed by a high pressure mercury lamp. Thus, the transfer body was created.

The transfer body was peeled off from the master, and wound on a stainless steel roll with a diameter of 20 cm so that the convex portions were on the outer side. Then, the roll was brought into contact with an adhesive sheet obtained by impregnating a nonwoven fabric with a weak adhesive composition containing 70 parts by mass of epoxy resin (jER828, Mitsubishi Chemical Corporation) and 30 parts by mass of phenoxy resin (YP-50, Nippon Steel & Sumikin Chemical Co., Ltd.) while rotating the roll. Next, the weak adhesive composition was deposited on the top surface of the convex portions to form the weak adhesive layer with a thickness of 1 µm. Thus, the transfer body was obtained.

The electrically conductive particles with an average particle diameter of 4 µm (nickel plated resin particles (AUL704, Sekisui Chemical Co., Ltd.)) were dispersed on the surface of the transfer body, and subsequently, the electrically conductive particles, which were not deposited to the weak adhesive layer, were removed by blowing. The number of times of the blowing was appropriately adjusted so that loss of electrically conductive particles could be intentionally created.

The transfer body, to which the electrically conductive particles were deposited, was pressed, at a temperature of 50° C. and with a pressure of 0.5 MPa, from the side on which electrically conductive particles were deposited, against a sheet-shaped thermosetting-type electrically insulating adhesive film with a thickness of 5 µm that is the electrically insulating adhesive base layer (a film formed from an electrically insulating adhesive composition containing 60 parts by mass of phenoxy resin (YP-50, Nippon Steel & Sumikin Chemical Co., Ltd.), 40 parts by mass of epoxy resin (jER828, Mitsubishi Chemical Corporation), 2 parts by mass of cationic curing agent (SI-60L, Sanshin Chemical Industry Co., Ltd.), and 20 parts by mass of silica fine particles (Aerosil RY200, Nippon Aerosil Co., Ltd.)). Thus, the electrically conductive particles were transferred to the electrically insulating adhesive base layer.

On the side of the electrically insulating adhesive base layer obtained, on which the electrically conductive particles were deposited, another sheet-shaped electrically insulating adhesive film with a thickness of 15 µm (a film formed from an insulating adhesive composition containing 60 parts by mass of phenoxy resin (YP-50, Nippon Steel & Sumikin Chemical Co., Ltd.), 40 parts by mass of epoxy resin (jER828, Mitsubishi Chemical Corporation), and 2 parts by mass of cationic curing agent (SI-60L, Sanshin Chemical Industry Co., Ltd.)) was overlapped as a transparent electrically insulating adhesive cover layer and laminated together at a temperature of 60° C. and with a pressure of 2 MPa. Thereby, the anisotropic conductive film was obtained.
(1-2) Production of Anisotropic Conductive Film Including Aggregation of Electrically Conductive Particles in Arrangement of Electrically Conductive Particles A transfer body master that was more likely to cause aggregation of electrically conductive particles was prepared. In the transfer body master, the depth of the concave portions was 4.4 µm, the inner diameter of the concave portions was 4.8 µm, and the distance between centers of adjacent concave portions was 5.6 µm. Thus, the density of the concave portions was increased to 32000/mm$^2$. There were no intentionally formed defects in the lattice arrangement of the concave portions.

The anisotropic conductive film was obtained by using this transfer body master and repeating (1-1) except that the number of times of blowing was reduced from that in (1-1).
(2) Formation of Mark The states of arrangement of the electrically conductive particles in the anisotropic conductive films produced in (1-1) and (1-2) were observed with an optical microscope (MX50, Olympus Corporation) from the electrically insulating adhesive cover layer-side. In the anisotropic conductive film of (1-1), a loss was found at 32% of all the lattice points and, in the anisotropic conductive film of (1-2), an aggregation was found at 26% of all the lattice points. In this example, the portion where no electrically conductive particle existed at 10 or more adjacent lattice points was evaluated as being a "loss", and the portion where 4 or more electrically conductive particles existed in contact with each other was evaluated as being an "aggregation".

In the case that a defective portion P, which was a loss or an aggregation, was found, a mark serving as the defective portion indication means was formed on the anisotropic conductive film. The mark was a laser irradiation mark.

The laser irradiation mark was formed by irradiating the electrically insulating adhesive cover layer with a laser beam by using a laser marker (ML-7111A) available from AMADA MIYACHI Colo., LTD. (irradiation condition: 7W). The formation location for the laser irradiation mark was a location adjacent to a side edge of the anisotropic conductive film in the longitudinal direction. The distance between a center of the laser irradiation mark and the defective portion P where a loss or an aggregation was found was 2 mm in the longitudinal direction of the anisotropic conductive film.

The size of the irradiation mark was approximately 350 µm in diameter.

The reaction rate of the resin in the electrically insulating adhesive cover layer was determined as follows. At a position 300 µm from the center of the irradiation mark, IR spectra, pre-mounting and post-mounting, were measured by using an infrared spectrophotometer (available from JASCO Corporation, product number FT/IR-4100). The reduction (%) in epoxy rings at the absorption wavelength or the reduction (%) in unsaturated groups at the absorption wavelength was calculated, and the reaction rate was 40%. At a position 700 µm from the center of the irradiation mark, the reaction rate was determined in the same manner and the reaction rate was 0%. This confirmed that the bonding ability of the anisotropic conductive film did not decrease at positions greater than or equal to 700 µm from the center of the irradiation mark and thus the connection ability was not impaired.

(3) Connection of Anisotropic Conductive Film Including a Mark to Electronic Component In each of the two types of anisotropic conductive films produced in (1), the mark was detected by using a monochrome camera module (available from Sony Corporation, XC-HR50) and a machine vision lens (available from MORITEX Corporation, MML1-ST65). The anisotropic conductive film was bonded to a substrate (glass substrate equipped with lines having a line width of 15 µm and an inter-line space of 15 µm) in such a manner that the defective portion P, indicated by the mark, was avoided. Further, the substrate was anisotropically conductively connected to a chip (IC chip having gold bumps, chip size of 15×100 µm, chip height of 15 µm, and inter-bump space of 15 µm), under the conditions of 180° C., 60 MPa, and 5 seconds.

(4) Evaluation of Connection Structure Including Substrate and Electronic Component The two types of connection structures obtained in (3) were evaluated in the following manner for (a) initial conduction resistance, (b) conduction reliability, and (c) short occurrence rate.

(a) Initial Conduction Resistance

The initial conduction resistance of the connection structure was measured by using a resistance measuring instrument (digital multimeter 7565, Yokogawa Electric Corporation). An initial conduction resistance of not greater than 0.5Ω may be evaluated as being good. The initial conduction resistance of each of the two types of connection structures was not greater than 0.5Ω.

(b) Conduction Reliability

The connection structures used in measurement of the initial conduction resistance were placed in an aging tester set to a temperature of 85° C. and a humidity of 85%, and the conduction resistance after being left for 500 hours was measured in the same manner as that for the initial conduction resistance. It is desirable that the conduction resistance after the aging test not be greater than 5Ω. The conduction resistance of each of the two types of connection structures after the aging test was not greater than 5Ω, and thus the conduction reliability was excellent.

(c) Short Occurrence Rate

For two types of connection structures obtained in the same manner as in (3), the presence or absence of occurrence of a short circuit between adjacent lines was investigated. It is desirable that the short occurrence rate not be greater than 50 ppm. The short occurrence rate of each of the two types of connection structures was not greater than 50 ppm.

From the above, it was observed that there was neither a poor conduction due to loss of electrically conductive particles nor an occurrence of a short circuit due to aggregation of electrically conductive particles.

REFERENCE SIGNS LIST 1, 1A, 1B, 1C, 1D Anisotropic conductive film
2 Electrically insulating adhesive
3 Electrically conductive particle
4 Electrically conductive particle dispersion layer
5 Base material film
6 Chip bonding location
7 Region between chip bonding location and sides of anisotropic conductive film
8 Chip non-bonding region
10 Mark detection device
11 Region to be removed
12 Half cut
13 Adhesive tape
14 Edge portion
15 Edge detection device
16 Thermocompression bonding device
17a, 17b Half cut
18 Cutting line
20 Memory card
30 Computing device
31 Identifying mark
32 Half cut formation means
33 Adhesive tape bonding means
34 Edge detection means
35 Thermocompression bonding device
36 Controller
100 Electronic component
P, P1, P2 Defective portion
Q Mark
a Flow direction of anisotropic conductive film at time of connection
L1 Distance between defective portion and center of mark in longitudinal direction of anisotropic conductive film
L2 Distance between defective portion and center of mark in short-side direction of anisotropic conductive film
L3 Distance between bonding reference location and center of mark

The invention claimed is:

1. An anisotropic conductive film including an electrically conductive particle dispersion layer, the electrically conductive particle dispersion layer including electrically conductive particles dispersed, in a predetermined dispersion state, in an electrically insulating adhesive, the electrically insulating adhesive provided on a base material film, the anisotropic conductive film comprising:
   a defective portion indication means configured to provide information about a location of a defective portion regarding the dispersion state of the electrically conductive particles.

2. The anisotropic conductive film according to claim 1, wherein the defective portion indication means comprises a mark provided for the anisotropic conductive film.

3. The anisotropic conductive film according to claim 2, wherein the mark is provided a predetermined distance away from the defective portion.

4. The anisotropic conductive film according to claim 2, wherein the mark is provided near a side edge of the anisotropic conductive film in a longitudinal direction of the anisotropic conductive film.

5. The anisotropic conductive film according to claim 2, wherein the electrically conductive particle dispersion layer includes the mark.

6. The anisotropic conductive film according to claim 2, wherein the base material film includes the mark.

7. The anisotropic conductive film according to claim 2, wherein the mark is a laser irradiation mark.

8. A bonding apparatus configured to bond the anisotropic conductive film according to claim 2 to an electronic component, the bonding apparatus comprising:
   a positioning means configured to, in accordance with the information about the location of the defective portion, position the anisotropic conductive film and the electronic component with respect to each other, to connect a defect-free portion of the anisotropic conductive film to a terminal of the electronic component, the information being obtained from the defective portion indication means;
   a pressing means configured to bond the anisotropic conductive film to the electronic component; and
   a mark detection device.

9. The bonding apparatus according to claim 8, wherein the bonding apparatus is configured to be used for the anisotropic conductive film wherein:
   the defective portion indication means comprises the mark provided for the anisotropic conductive film,
   the mark is provided the predetermined distance away from the defective portion,
   the distance between the center of the mark and the defective portion is less than or equal to 5 mm in the longitudinal direction of the anisotropic conductive film,
   the mark is provided near the side edge of the anisotropic conductive film in the longitudinal direction of the anisotropic conductive film,
   the electrically conductive particle dispersion layer includes the mark,
   the anisotropic conductive film comprises the base material film, and the base material film includes the mark,
   the mark is the laser irradiation mark, and
   the bonding apparatus includes a mark detection device.

10. The anisotropic conductive film according to claim 1, wherein a distance between a center of the mark and the defective portion is less than or equal to 5 mm in a longitudinal direction of the anisotropic conductive film.

11. The anisotropic conductive film according to claim 1, wherein the defective portion indication means comprises a defective portion information storage means, and
    the defective portion information storage means includes a recording medium containing the information about the location of the defective portion.

12. The anisotropic conductive film according to claim 11, wherein the defective portion information storage means includes the recording medium, the recording medium containing defective portion information, and
    the recording medium accompanies the anisotropic conductive film.

13. The anisotropic conductive film according to claim 11, wherein the defective portion information storage means includes a computing device for management of the anisotropic conductive film, and
    the anisotropic conductive film is provided with an identifying mark configured to enable defective portion information to be obtained from the computing device.

14. A method for bonding the anisotropic conductive film according to claim 1 to an electronic component, the method comprising, in accordance with the information about the location of the defective portion, bonding a defect-free portion of the anisotropic conductive film to a region where a terminal or a terminal array is present in the electronic component to be anisotropically conductively connected, the information being obtained from the defective portion indication means.

15. The method according to claim 14,
    wherein, in a case that the anisotropic conductive film includes a base material film, the method comprises
    in accordance with the information about the location of the defective portion, removing a specified region including the defective portion from the electrically conductive particle dispersion layer, and
    bonding a remaining defect-free portion of the anisotropic conductive film to the electronic component.

16. The method according to claim 14,
    wherein the method comprises,
    in accordance with the information about the location of the defective portion, forwarding the anisotropic conductive film to allow a specified region including the defective portion to exit, and
    bonding a remaining defect-free portion of the anisotropic conductive film to the electronic component.

17. The method according to claim 14,
    wherein the method comprises,
    in accordance with the information about the location of the defective portion, cutting away a specified region including the defective portion of the anisotropic conductive film, and
    bonding a remaining defect-free portion of the anisotropic conductive film to the electronic component.

18. The method according to claim 14,
    wherein the method comprises
    transmitting information of an identifying mark to a computing device for management to obtain defective portion information from the computing device for management, and
    using the information about the defective portion.

19. A connection structure comprising a first electronic component and a second component, wherein the first electronic component is connected to the second electronic component by anisotropic conductive connection through the anisotropic conductive film according to claim 1.

20. A method of manufacturing a connection structure of claim 19, comprising connecting a first electronic component to a second component by anisotropic conductive connection through the anisotropic conductive film including: an electrically conductive particle dispersion layer, the electrically conductive particle dispersion layer including electrically conductive particles dispersed, in the predetermined dispersion state, in an electrically insulating adhesive, the anisotropic conductive film comprising:

the defective portion indication means configured to provide information about the location of the defective portion regarding the dispersion state of the electrically conductive particles.

* * * * *